United States Patent
Downes, Jr. et al.

(10) Patent No.: US 6,829,823 B2
(45) Date of Patent: Dec. 14, 2004

(54) METHOD OF MAKING A MULTI-LAYERED INTERCONNECT STRUCTURE

(75) Inventors: Francis J. Downes, Jr., Vestal, NY (US); Donald S. Farquhar, Endicott, NY (US); Elizabeth Foster, Friendsville, PA (US); Robert M. Japp, Vestal, NY (US); Gerald W. Jones, Apalachin, NY (US); John S. Kresge, Binghamton, NY (US); Robert D. Sebesta, Endicott, NY (US); David B. Stone, Jericho, VT (US); James R. Wilcox, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 122 days.

(21) Appl. No.: 10/067,551

(22) Filed: Feb. 5, 2002

(65) Prior Publication Data

US 2002/0085364 A1 Jul. 4, 2002

Related U.S. Application Data

(60) Division of application No. 09/540,172, filed on Mar. 31, 2000, now Pat. No. 6,373,717, which is a continuation-in-part of application No. 09/346,356, filed on Jul. 2, 1999, now Pat. No. 6,351,393.

(51) Int. Cl.[7] ................................................ H01K 3/10
(52) U.S. Cl. ............................ 29/852; 29/846; 427/97; 427/99
(58) Field of Search ..................... 29/846, 852; 427/97, 427/99

(56) References Cited

U.S. PATENT DOCUMENTS 4,642,160 A * 2/1987 Burgess ....................... 216/18

| 4,882,454 A | 11/1989 | Peterson et al. |
| 5,072,075 A | 12/1991 | Lee et al. |
| 5,121,190 A | 6/1992 | Hsiao et al. |

(List continued on next page.)

FOREIGN PATENT DOCUMENTS

| JP | 1-307294 | 12/1989 |
| JP | 6-112271 | 4/1994 |
| JP | 9-232376 | 9/1997 |

(List continued on next page.)

OTHER PUBLICATIONS

IBM Technical Disclosure Bulletin, vol. 32, No. 3B, Aug. 1989, "Multilayer Polymer Substrate for Direct Chip Attachment."

(List continued on next page.)

*Primary Examiner*—Richard Chang
(74) *Attorney, Agent, or Firm*—Schmeiser, Olsen & Watts; William H. Steinberg

(57) ABSTRACT

A method of making a multi-layered interconnect structure. First and second electrically conductive members are formed on the first and second dielectric layers, respectively. The dielectric layer are formed on opposing surfaces of a thermally conductive layer. A first and second electrically conductive layer is formed within the first dielectric layer. The second electrically conductive layer includes shielded signal conductors and is positioned between the first electrically conductive layer and the thermally conductive layer. A plated through hole (PTH) formed through the interconnect structure is electrically connected to one of the first and second electrically conductive members and to one of the shielded signal conductors. A third dielectric layer, formed on the first dielectric layer and on portions of the first electrically conductive members, substantially overlies the PTH and includes a high density interconnect layer for providing an electrical path from an electronic device to the shielded signal conductors.

25 Claims, 5 Drawing Sheets

U.S. PATENT DOCUMENTS

| | | | |
|---|---|---|---|
| 5,483,421 A | | 1/1996 | Gedney et al. |
| 5,574,630 A | | 11/1996 | Kresge et al. |
| 5,615,087 A | | 3/1997 | Wieloch |
| 5,661,089 A | | 8/1997 | Wilson |
| 5,798,563 A | * | 8/1998 | Feilchenfeld et al. ....... 257/668 |
| 5,894,173 A | | 4/1999 | Jacobs et al. |
| 5,900,675 A | | 5/1999 | Appelt et al. |
| 5,926,377 A | * | 7/1999 | Nakao et al. ................ 361/763 |
| 5,982,630 A | | 11/1999 | Bhatia |
| 6,098,282 A | * | 8/2000 | Frankeny et al. ............. 29/852 |
| 6,407,341 B1 | * | 6/2002 | Anstrom et al. ............ 174/255 |
| 6,486,394 B1 | * | 11/2002 | Schmidt et al. ............... 174/36 |
| 6,675,473 B2 | * | 1/2004 | Ross et al. .................... 29/852 |

FOREIGN PATENT DOCUMENTS

| | | |
|---|---|---|
| JP | 10-209347 | 8/1998 |
| JP | 11-87560 | 3/1999 |
| JP | 2000-22071 | 1/2000 |
| JP | 2000-24150 | 1/2000 |

OTHER PUBLICATIONS

Process Considerations in the Fabrication of Teflon Printed Circuit Boards, Light et al., 1994 Proceedings, 44 Electronic Components & Technology Conference, 5/94.

High Performance Carrier Technology: Materials and Fabrication, Light et al., 1993 International Electronics Packaging Conference, San Diego, CA Volume One.

High Performance Carrier Technology, Heck et al., 1993 International Electronics Packaging Conference, San Diego, CA, Volume One.

* cited by examiner

METHOD OF MAKING A MULTI-LAYERED INTERCONNECT STRUCTURE

This application is a divisional of Ser. No. 09/540,172, filed on Mar. 31, 2000, now U.S. Pat. No. #6,373,717 which was a continuation-in-part of Ser. No. 09/346,356, filed on Jul. 2, 1999, now U.S. Pat. No. #6,351,393.

The present patent application is a continuation-in-part of U.S. patent application Ser. No. 09/346,356, filed Jul. 2, 1999 and entitled "Electronic Package For Electronic Components and Method of Making Same."

BACKGROUND OF THE INVENTION

1. Technical Field

The present invention relates, in general, to an electronic package for interconnecting a semiconductor chip to a printed circuit board, and in particular, to an organic multi-layered interconnect structure that includes a high density interconnect layer such as an allayed surface layer.

2. Related Art

Organic substrates, such as chip carriers, have been and continue to be developed for many applications. Organic substrates are expected to displace ceramic substrates in many chip carrier applications because of reduced cost and enhanced electrical performance. An organic substrate, such as an organic chip carrier for interconnecting a semiconductor chip to a printed circuit board in an electronic package, may have a surface redistribution layer for redistributing electrical signals from the chip into a larger area so that the chip can properly interface with the printed circuit board.

As semiconductor chip input/output (I/O) counts increase beyond the capability of peripheral lead devices and as the need for both semiconductor chip and printed circuit board miniaturization increases, area array interconnects will be the preferred method for making large numbers of connections between a semiconductor chip and an organic chip carrier, and between the organic chip carrier and a printed circuit board. If the coefficient of thermal expansion (CTE) of the semiconductor chip, the organic chip carrier, and the printed circuit board are substantially different from one another, industry standard semiconductor chip array interconnections to the organic chip carrier may be subject to high stress during thermal cycling operation. Similarly, the industry standard ball grid array (BGA) interconnections between the organic chip carrier and printed circuit board may also be subject to high stress during operation. Significant reliability concerns may then become manifest by failure of the connections or even failure of the integrity of the semiconductor chip (chip cracking). These reliability concerns significantly inhibit design flexibility. For example, semiconductor chip sizes may be limited or interconnect sizes, shapes and spacing may have to be customized beyond industry standards to reduce these stresses. These limitations may limit the electrical performance advantages of the organic electronic package or add significant cost to the electronic package. Typically, a semiconductor chip has a CTE of 2–3 parts per million per degree Celsius (ppm/° C.) while a standard printed circuit board has a much greater CTE of 17–20 ppm/° C.

A particular reliability concern is that the surface redistribution layer, which interfaces between the organic substrate and the semiconductor chip, may be susceptible to stresses resulting from thermal cycling of the organic substrate together with a chip solderably coupled with the organic substrate. Such stresses result from a CTE differential between the surface redistribution layer and the remainder of the organic substrate. The ability of the surface redistribution layer to withstand such stresses depends on mechanical properties of the surface redistribution layer. If the redistribution layer cannot accommodate the thermal stresses, then the surface redistribution layer is susceptible to deterioration, such as cracking, which can cause failure of interconnections between the organic chip carrier and semiconductor chip, as well as between the organic chip carrier and printed circuit board. Thus, it is desirable for the surface redistribution layer to include a material having thermal and mechanical properties that enable the redistribution layer to reliably retain its structural integrity during thermal cycling operations.

SUMMARY OF THE INVENTION

The present invention provides a multi-layered interconnect structure, comprising:

a thermally conductive layer including first and second opposing surfaces;

a first and a second dielectric layer positioned on the first and the second opposing surfaces, respectively, of the thermally conductive layer;

first and second pluralities of electrically conductive members positioned on said first and second dielectric layers, respectively;

a first electrically conductive layer within said first dielectric layer;

a second electrically conductive layer within said first dielectric layer and positioned between said first electrically conductive layer and said thermally conductive layer, wherein said second electrically conductive layer comprises a first plurality of shielded signal conductors;

a plated through hole through the multi-layered interconnect structure electrically connected to at least one member of said first plurality of electrically conductive members, to at least one of said first plurality of shielded signal conductors, and to at least one member of said second plurality of electrically conductive members; and a third dielectric layer positioned on said first dielectric layer and on portions of said first plurality of electrically conductive members, said third dielectric layer substantially overlying said plated through hole, and wherein said third dielectric layer includes a first high density interconnect layer for providing an electrical path from a first electronic device to the first plurality of shielded signal conductors.

The present invention provides a method of making a multi-layered interconnect structure, comprising the steps of:

providing a thermally conductive layer including first and second opposing surfaces;

forming first and second dielectric layers on said first and second opposing surfaces, respectively, of said thermally conductive layer;

forming first and second pluralities of electrically conductive members on said first and second dielectric layers, respectively;

forming a first electrically conductive layer within said first dielectric layer;

forming a second electrically conductive layer within said first dielectric layer and positioned between said first electrically conductive layer and said thermally conductive layer, wherein said second electrically conductive layer comprises a first plurality of shielded signal conductors;

forming a plated through hole through the multi-layered interconnect structure electrically connected to at least one member of said first plurality of electrically conductive members, to at least one of said first plurality of shielded signal conductors, and to at least one member of said second plurality of electrically conductive members; and forming a third dielectric layer on said first dielectric layer and on portions of said first plurality of electrically conductive members, said third dielectric layer substantially overlying said plated through hole, and wherein said third dielectric layer includes first high density interconnect layer for providing an electrical path from a first electronic device to the first plurality of shielded signal conductors.

The present invention has the advantage of using a material in the surface redistribution layer that reliably retains its structural integrity during thermal cycling operations and, in particular, satisfies the stringent standards of Thermal Acceptance Testing (TAT), to be described infra.

The present invention has the advantage of having a high density interconnect layer for providing a direct electrical path from the multi-layered interconnect structure to an external electronic device.

The present invention has the advantage of using a material in the surface high density interconnect layer that does not include a substance capable of vaporizing during thermal cycling, wherein such vaporization would cause shrinkage of the redistribution layer.

The present invention has the advantage of providing a high density interconnect layer having an exposed surface that is intrinsically rough. Since the surface roughness facilitates subsequent deposition of conductive metal on the surface, additional process steps to purposefully create surface roughness are avoided.

DETAILED DESCRIPTION OF THE INVENTION

Figure 1:
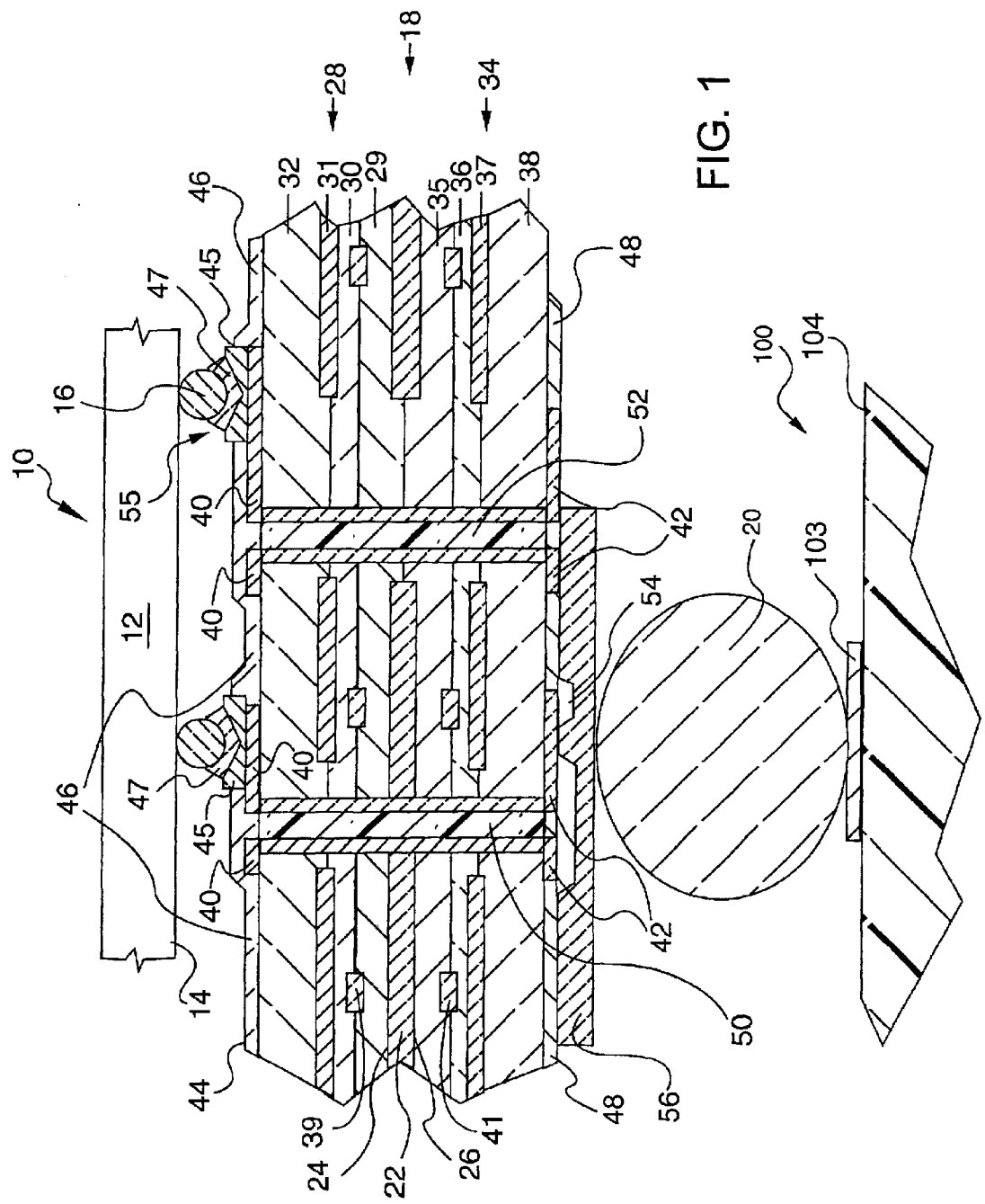
FIG. 1 is a front sectional view of an electronic package that includes a semiconductor chip assembled to a multi-layered interconnect structure, and the multi-layered interconnect structure assembled to a circuitized substrate, in accordance with preferred embodiments of the present invention.

The present invention provides an electronic package which includes a multi-layered interconnect structure (e.g., a substrate comprising organic dielectric material, such as an organic chip carrier) and a semiconductor chip, the multi-layered interconnect structure being relatively compliant and having a coefficient of thermal expansion (CTE) of about 10 to about 12 ppm/° C. which will not cause failure of interconnections between the semiconductor chip and a printed circuit board to which the package can be assembled. The multi-layered interconnect structure may be comprised of a single layer as an embodiment of the present invention. Failure of an interconnection, such as a solder interconnection, is defined as an increase of at least one ohm in electrical resistance of the interconnection as a consequence of being subjected to each test (i.e., test category) of Thermal Acceptance Testing (TAT), wherein the interconnection is actually tested under each TAT test or is alternatively subjected to engineering calculation or computer simulations which determine, according to accepted engineering standards and methodology, whether the interconnection would experience said increase of at least one ohm in electrical resistance if actually subjected to each TAT test. The electrical resistance of the interconnection prior to TAT is used as a reference value for calculating said increase in electrical resistance following any TAT test. Passing of an interconnection is defined as not failing. Thermal Acceptance Testing includes the following four test categories: an air-to-air test, a wet thermal shock test, a thermal cycle test, and a power cycle test.

The air-to-air test is the Joint Electron Device Engineering Council (JEDEC) test method A104-A, condition G, which includes immersion of the organic substrate with an attached chip in air at −40° C. until both the organic substrate and the attached chip are at −40° C. throughout (typically 10 minutes), followed by immersion in another bath of air at 125° C. until both the organic substrate and the attached chip are at 125° C. throughout (typically 10 minutes), for 1000 cycles.

The wet thermal shock test is the JEDEC test method A106-A, which includes immersion of the organic substrate with an attached chip in a liquid bath at −40° C. until both the organic substrate and the attached chip are at −40° C. throughout (typically 10 minutes), followed by immersion in another liquid bath at 125° C. until both the organic substrate and the attached chip are at 125° C. throughout (typically 10 minutes), for 100 cycles.

The thermal cycle test cycles the whole assembly (organic substrate with attached chip and attached circuit card) in a chamber of air that cycles the air from 0° C. to 100° C. for 3600 cycles, wherein the extreme chamber temperatures of 0° C. and 100° C. are each maintained until the whole assembly reaches a uniform steady-state temperature.

The power cycle test cycles the whole assembly (organic substrate with attached chip and attached circuit card) from 25° C. (i.e., ambient room temperature) to 125° C., for 3600 cycles. During the heating phase, the chip is powered up and serves as the heat source for the whole assembly. The high-temperature end of a cycle occurs when the chip is at 125° C. with a consequent temperature distribution across the entire assembly that is intended to realistically simulate temperature distributions that would occur during actual field operation.

Referring to FIG. 1, a partial sectional view, in elevation, of one embodiment of the electronic package 10 of the invention is shown. The electronic package 10 includes an electronic device, such as a semiconductor chip 12 having a first surface 14, the first surface including a plurality of contact members 16, thereon. The plurality of contact members 16 are preferably Controlled Collapse Chip Connection (C4) solder balls, each coupled to a respective contact (not shown) on the chip's first surface 14. Other contact member shapes that can be used in this invention are columns and cylinders. C4 solder balls are comprised of solder material preferably having a composition of about 97% lead and about 3% tin with a melting point of about 310° C. The electronic package includes a multi-layered interconnect structure 18, preferably an organic chip carrier, adapted for electrically interconnecting the semiconductor chip 12 to an electronic device such as a circuitized substrate 100 (e.g., a printed circuit board) by means of a first plurality of solder connections, preferably solder balls such as ball grid array (BGA) solder balls. The multi-layered interconnect structure 18 (which will be described infra in detail) includes a thermally conductive layer 22 having first and second opposing surfaces 24 and 26, respectively. A first dielectric layer 28, which may include sublayers 29, 39, 30, 31 and 32, is positioned on the first opposing surface 24. A second dielectric layer 34, which may include sublayers 35, 41, 36, 37 and 38, is positioned on the second opposing surface 26. Layers 29, 30 and 32 of first dielectric layer 28, and layers 35, 36 and 38 of second dielectric layer 34 are composed of an organic polymeric material, preferably filled with a particulate material. The dielectric constant of these dielectric layers is preferably from about 1.5 to about 3.5, and more preferably from about 2 to about 3. The thickness of the filled dielectric layers can vary according to the desired design performance characteristics of the multi-layered interconnect structure 18, and said thicknesses may be about equal if so dictated by design performance requirements. Preferably, the thickness of each of the dielectric layers 28 and 34 is from about 0.001 inches (1 mil) to about 9 mils. Significantly, the dielectric material of the dielectric layers 28 and 34 does not contain conventional woven fiberglass. Such absence of woven fiberglass enables through holes to be closely spaced. Indeed, spacing between through hole centers of less than 100 mils, preferably less than 50 mils but more preferably about 25 mils and most preferably less than 10 mils, is achievable without electrical shorting between adjacent conductive through holes. Preferably, the particulate filler has a diameter less than about 10 $\mu$m, more preferably from about 5 to about 8 $\mu$m. Preferably, the particulate filler is present from about 30 to about 70 percent by weight, more preferably from about 40 to about 60 percent by weight of the material. Preferably, the particulate filler is silica. Suitable materials for the dielectric layer include, for example, cyanate ester and polytetrafluoroethylene. A suitable silica filled polytetrafluoroethylene is available as HT 2800 from Rogers Corporation (Rogers, Conn.). First dielectric layer 28 can also include first conductive layer 31, between the dielectric layers 30 and 32 for serving as power and/or ground connections. Second dielectric layer 34 can also include third conductive layer 37, between the dielectric layers 36 and 38 for serving as power and/or ground connections. The first dielectric layer 28 and the second dielectric layer 34 can further include second and fourth electrically conductive layers 39 and 41, respectively. Electrically conductive layers 39 and 41 are preferably signal carrying conductors. The second electrically conductive layer 39 is positioned between the first electrically conductive layer 31 and the thermally conductive layer 22. The fourth electrically conductive layer 41 is positioned between the third electrically conductive layer 37 and the thermally conductive layer 22. Electrically conductive layers 31, 37, 39, and 41 can be comprised of a suitable metal such as copper or aluminum, (preferably copper) and can have a thickness of from about 0.20 to about 1.0 mils, preferably about 0.50 mils. An aspect of the current invention is that each of the signal carrying layers 39 and 41 is shielded on either side by an electrically conducting layer which significantly reduces signal noise. Signal carrying layer 39 is shielded by electrically conducting layers 31 and 22, while signal carrying layer 41 is shielded by electrically conducting layers 37 and 22.

A first plurality of electrically conductive members 40 is positioned on the first dielectric layer 28 and a second plurality of electrically conductive members 42 is positioned on the second dielectric layer 34. These electrically conductive members 40 and 42 are preferably comprised of a metal, the preferred metal being copper. The first and second pluralities of electrically conductive members 40 and 42 can each have thicknesses ranging from about 0.25 to about 1.5 mils. A first plurality of solder connections 47 positioned on a first plurality of microvias 55 and in electrical contact with the first plurality of electrically conductive members 40 are electrically connected to respective ones of the plurality of contact members 16 on the semiconductor chip 12. The first plurality of microvias 55 are a first plurality of openings with internal walls formed in a third dielectric layer 46 that expose at least portions of the first plurality of electrically conductive members 40. Each of the first plurality of openings includes a layer of electrically conductive material 45, preferably copper, positioned on the internal walls of the first plurality of openings and on portions of selected ones of the plurality of first electrically conductive members 40. The first plurality of solder connections 47 are comprised of a low melt solder (melting temperature below about 230° C.), preferably eutectic solder, comprised of a composition of about 63% lead and about 37% tin The thermally conductive layer 22 is comprised of a material having a selected thickness and coefficient of thermal expansion to substantially prevent failure of the first plurality of solder connections 47 between the first plurality of electrically conductive members 40 and semiconductor chip 12. Thermally conductive member (or layer) 22 can be a suitable metal comprised of nickel, copper, molybdenum, or iron. Preferably, the thermally conductive layer 22 also functions as a ground plane. The preferred thermally conductive layer 22 (which has a CTE of close to zero, preferably between about 4 ppm/° C. and about 8 ppm/° C.) is a three layered structure comprised of a first layer of copper, a second layer of an alloy of about 34% to about 38% nickel (preferably about 36% nickel) and about 62% to about 66% iron (preferably about 63% iron), and a third layer of copper. The overall CTE (i.e., spatially averaged CTE) of thermally conductive layer 22 is from about 4 to about 8 ppm/° C. Preferably, about 72% to about 80% of the thickness of the thermally conductive layer 22 is the nickel-iron alloy and about 20% to about 28% of the thickness of the thermally conductive layer is copper. A suitable 36% nickel-63% iron alloy is available from Texas Instruments Incorporated (Attleboro, Mass.). Alternatively, the thermally conductive layer 22 can be formed solely of a single metal alloy such as a about 36% nickel- about 63% iron alloy. The thickness of the thermally conductive layer 22 is preferably from only about 1 mil to about 3 mils. The thickness and choice of material for the thermally conductive layer 22 will determine the CTE of the thermally conductive layer 22 and, significantly, can be used to control the overall CTE of the multi-layered interconnect structure 18 when used in combination with the other elements defined herein. When the CTE is about 10 to about 12 ppm/° C., a significant advantage is achieved. Strain control on the first plurality of solder connections 47 of the electronic package 10 is realized and localized regions of high strain are avoided during operation of the electronic package 10 (when assembled to a circuitized substrate and in field operation). The overall strain between the semiconductor chip 12, with a CTE of about 2–3 ppm/° C., and the circuitized substrate 100, with a CTE of about 17–20 ppm/° C., is thus significantly reduced in magnitude. To prevent failure of interconnections within the multi-layered interconnect structure 18, between the multi-layered interconnect structure 18 and the semiconductor chip 12, and between the circuitized substrate 100 and the multi-layered interconnect structure 18, the difference between the overall CTE of the multi-layered interconnect structure 18 and the CTE of the semiconductor chip 12 should be between about 40% and about 70% (but preferably between about 40% and about 60%) of the difference between the CTE of the circuitized substrate 100 and the CTE of the semiconductor chip 12. For controlling the CTE of the multi-layered interconnect structure 18 to prevent failure of the aforementioned interconnections, it is noted that the overall CTE of the multi-layered interconnect structure 18 depends on both the CTE and thickness of the thermally conductive layer 22. It is accordingly preferred that the CTE of the thermally conductive layer 22 be between about one third and about two thirds (depending on the thickness of the thermally conductive layer 22) of the overall CTE of the multi-layered interconnect structure 18.

Layers 29, 30, 32 of first dielectric layer 28 and layers 35, 36, and 38 of second dielectric layer 34 are preferably comprised of a filled organic polymeric material having an effective modulus from about 0.01 to about 0.50 Million pounds per square inch (Mpsi), and preferably the effective modulus is from about 0.03 to about 0.10 Mpsi. The dielectric material of layers 29, 30, 32, 35, 36, and 38 includes material which can deform in an elastic manner under stress, and if subjected to sufficient stress can deform in an elastic-plastic manner. The effective modulus is defined as a secant modulus which in turn is defined as a relation of the tensile stress to total strain of an elastic-plastic stress-strain material test stress response curve (see, for example, A. Blake, "Practical Stress Analysis in Engineering Design", Marcel Dekker: 270 Madison Ave., New York, N.Y. 10016, 1982.) It is useful to employ a dielectric material having a measured tensile secant modulus within the range of 0.01 to 0.5 Mpsi, measured at room temperature, with a strain rate between the values of 0.01/min and 0.6/min, with the test conducted at a temperature between 10 and 30° C. When the first and second dielectric layers 28 and 34, respectively, are comprised of a material with this effective modulus, the multi-layered interconnect structure is relatively compliant, and warpage during operation of the electronic package is greatly reduced. This unique combination of the reduced CTE thermally conductive layer and the compliant (during operation) dielectric layers assures the prevention of failure of the first plurality of solder connections 47 between the semiconductor chip 12 and multi-layered interconnect structure 18, and between structure multi-layered interconnect 18 and the circuitized substrate 100. As a result, semiconductor chip 12 will experience much less warpage than would occur with laminates made of typical organic materials. Multi-layered interconnect structure 18 is capable of absorbing a modest amount of internal shear strain under the die. If an encapsulant is applied between the semiconductor chip 12 and the multi-layered interconnect structure 18, the compliancy of the structure will result in significantly less stress within the encapsulant. The combination of the strain control on the first plurality of solder connections 47 and the reduced tendency for the electronic package 10 to warp both contribute to preventing failure of the first plurality of solder connections 47 between the first plurality of electrical conductive members 40 and semiconductor chip 12.

A first plated through hole 50 (i.e., a first through hole plated with a metal, preferably copper) is positioned under semiconductor chip 12 and is electrically connected to at least one electrically conductive member of the first plurality of electrically conductive members 40 and to at least one electrically conductive member of the second plurality of electrically conductive members 42. Although not explicitly shown in FIG. 1, the first plated through hole 50 is also electrically connected to at least one of the first plurality of shielded signal conductors which comprise conductive layer 39. A second plated through hole 52 (i.e., a second through hole plated with a metal, preferably copper) is positioned under semiconductor chip 12 and is also electrically connected to at least one electrically conductive member of the first plurality of electrically conductive members 40 and to at least one electrically conductive member of the second plurality of electrically conductive members 42. Although not explicitly shown in FIG. 1, the second plated through hole 52 is also electrically connected to at least one of the second plurality of shielded signal conductors which comprise conductive layer 41. First and second plated through holes 50 and 52, respectively, have an unplated diameter from about 1.5 to about 3.0 mils and can be formed by mechanical or laser drilling, preferably by laser drilling with a commercial YAG or excimer laser. The plated through holes 50 and 52 each include a layer of about 0.15 to about 1.0 mils of a suitable plated metal, preferably copper on internal walls of the through holes 50 and 52. It is preferable that each contact site of the semiconductor chip be electrically connected to no more than one plated through hole of the multi-layered interconnect structure 18.

The third dielectric layer 46 of the multi-layered interconnect structure 18 is positioned on the first dielectric layer 28 and on at least a portion of selected ones of the first plurality of electrically conductive members 40. The third dielectric layer 46 can substantially cover (i.e., tent) the first and second plated through holes 50 and 52, respectively. The fourth dielectric layer 48 is positioned on the second dielectric layer 34 and on at least a portion of selected ones of the second plurality of electrically conductive members 42. The fourth dielectric layer 48 of the multi-layered interconnect structure 18 can substantially cover (i.e., tent) the first and second plated through holes 50 and 52, respectively. The third and fourth dielectric material and fourth dielectric material may substantially fill the plated through holes 50 and 52, respectively, as shown. Alternatively, the plated through holes 50 and 52 may be filled with a material other than the third and fourth dielectric material prior to positioning the third dielectric layer 46 and the fourth dielectric layer 48 on the first dielectric layer 28 and the second dielectric layer 34, respectively.

Dielectric material of the third dielectric layer 46 ("third dielectric material") and of the fourth dielectric layer 48 ("fourth dielectric material") can be a suitable organic polymeric material. A preferred third and fourth dielectric material is a resin comprising an allylated polyphenylene ether (APPE). The APPE material may be utilized in the form of the APPE resin coated onto a metal foil, such as a copper foil. A commercially available APPE that is suitable for the present invention is manufactured by the Asahi Chemical Company of Japan and is identified as Asahi product number PC5103, which comprises the resin coated onto a copper foil. The APPE material is particularly suitable for the third and fourth dielectric material of the present invention, because the APPE material retains its structural integrity, and does not crack, when subjected to Thermal Acceptance Testing, described supra. Several factors help explain why the APPE material holds up well during Thermal Acceptance Testing. A first factor is that the allyl group of the APPE can form cross links and thus add hardness and stiffness to the polyphenylene ether polymer. A second factor is that the Asahi material includes a filler of about 40% silica, which lowers the CTE of the APPE material to about 40 ppm/° C., which is about 20% to about 30% below the CTE of other organic polymers that do not include the silica filler. The lowering of the CTE of the APPE material by the silica improves thermal compatibility of the third layer 46 and the fourth layer 48 with the remaining multi-layered interconnect structure which preferably has a CTE of about 10 to about 12 ppm/° C. A mismatch between the CTE of the third and fourth dielectric materials and the lower CTE of other structural components of the electronic package 10 is considered to be a significant factor in determining whether the third and fourth dielectric materials will retain its structural integrity and resist cracking. Another beneficial characteristic of the APPE material is an absence of volatile solvents capable of vaporizing while being laminated (e.g., by vacuum lamination) to the first dielectric layer 28 or the second dielectric layer 34, wherein such vaporization would cause shrinkage of the redistribution layer.

Third dielectric layer 46 includes the first plurality of microvias 55. The first plurality of microvias 55 constitute a first plurality of openings defined by internal walls formed in third dielectric layer 46, said openings exposing portions of selected ones of the first plurality of electrically conductive members 40. Each of the first plurality of openings includes a layer of electrically conductive material 45 positioned on the internal walls of the first openings and, preferably, also on the exposed portions of the first plurality of electrically conductive members 40. Generally, a microvia that includes a layer of electrically conductive material positioned on its internal walls is designated as a "plated blind via." Selected ones of the first plurality of microvias 55 (or plated blind vias 55) are electrically (i.e., conductively) coupled to respective ones of the first plurality of solder connections 47, and thus electrically coupled to the first plurality of electrically conductive members 40. One plated blind via, in addition to the first plurality of microvias 55, is within the scope of the present invention and, accordingly, at least one plated blind via (such as one of plated blind vias 55) may be conductively coupled to one of the first plurality of electrically conductive members 40. The first plurality of solder connections 47 are designed to efficiently match the pattern of contact members 16 on semiconductor chip 12. Preferably, there is a match of no more than one contact member 16 with one of the plated through holes 50 or 52 under the semiconductor chip providing a direct electrical path from each of the contact members 16 to either the signal carrying second electrical conductive layer 39 (through one of the solder connections 47, one of the first electrically conductive members 40, and plated through hole 50) or to the signal carrying fourth electrically conductive layer 41 (through one of the solder connections 47, another first electrically conductive member 40, and through plated through hole 52). Thus the third dielectric layer 46 comprises a high density interconnect layer for providing a direct electrical path from a contact member 16 to a shielded signal conductor, which provides a relatively short and efficient electrical path for signals to be transmitted from the semiconductor chip 12 through the multi-layered interconnect structure 18. Similarly, the fourth dielectric layer 48 comprises a high density interconnect layer for providing a direct electrical path from the multi-layered interconnect structure 18 to the circuitized substrate 100 through the second plurality of solder connections 20.

The fourth dielectric layer 48 includes a second plurality of microvias 54. The second plurality of microvias 54 are a second plurality of openings with internal walls formed in the fourth dielectric layer that expose portions of electrically conductive members 42. Each of the second plurality of openings 54 includes a layer of electrically conductive material positioned on the internal walls of the openings and on the exposed portions of the second plurality of electrically conductive members 42 to form a plurality of conductive bonding pads 56. The conductive material on the internal walls of the first and second pluralities of openings and on the exposed portions of the first and second pluralities of electrically conductive members 40 and 42 in the third and fourth dielectric layers is preferably plated copper. As shown in FIG. 1, the semiconductor chip 12 is conductively coupled to the first plurality of microvias 55 by the plurality of contact members 16 (e.g., C4 solder balls). Generally, any electronic device (e.g., a semiconductor chip such as the semiconductor chip 12) may be conductively coupled to a microvia of the first plurality of microvias 55. Further, one microvia (or plated blind via), in addition to the first plurality of microvias 55, in the third dielectric material 46 is within the scope of the present invention The electronic package can further include a circuitized substrate 100 having a plurality of contact pads 103 on a first surface 104, which pads are electrically connected to respective ones of second plurality of solder connections 20 (e.g., solder balls) on multi-layered interconnect structure 18. Typically, the second plurality of solder connections 20 are arranged as solder balls in a ball grid array (BGA) arrangement to efficiently allow electrical signal transmission and power distribution out of and into the electronic package. The second plurality of solder connections 20 can also be comprised of columns or other shapes to provide the appropriate stand off and appropriate strain relief between multi-layered interconnect structure 18 and circuitized substrate 100. Typically the solder balls are comprised of a low melt solder metallurgy, preferably a eutectic solder material. As shown in FIG. 1, the circuitized substrate 100 is conductively coupled to the second plurality of microvias 54 by the second plurality of solder connections 20 (e.g., BGA solder balls). Generally, any electronic device (e.g., a circuitized substrate such as the circuitized substrate 100) may be conductively coupled, by one of the second plurality of solder connections 20 on one of the conductive bonding pads 56, to a microvia of the second plurality of microvias 54. Further, one microvia (or plated blind via), in addition to the second plurality of microvias 54, in the fourth dielectric material 48 is within the scope of the present invention.

The multi-layered interconnect structure 18 has an overall CTE that prevents failure of: the first solder connections 47, the second solder connections 20, and interconnections within the multi-layered interconnect structure 18. The difference between the overall CTE of the multi-layered interconnect structure 18 and the CTE of the semiconductor chip 12 is preferably between about 40% and about 60% of the difference between the CTE of the circuitized substrate 100 and the CTE of the semiconductor chip 12. The thermally conductive layer 22 has a thickness and CTE to prevent failure of: the solder connections 47, the solder connections 20, and interconnections within the multi-layered interconnect structure 18. In particular, the thermally conductive layer 22 has a CTE that is between about one third and about two thirds of the CTE of overall CTE of the multi-layered interconnect structure 18.

Although not shown in FIG. 1, a stiffener ring for mechanically stabilizing the multi-layered interconnect structure 18 may be adhesively bonded to an outer portion of a top surface 44 of the multi-layered interconnect structure 18, such as to an outer perimeter portion. An organic chip carrier, such as the multi-layered interconnect structure 18, that is made of such compliant organic material (e.g., a material having a modulus of less than 300,000 psi) cannot be easily handled. The stiffener ring, which is rigid, enhances the structural characteristics of the chip carrier (i.e., the multi-layered interconnect structure 18) by making the chip carrier more mechanically stable and thus easier to handle.

Figure 2:
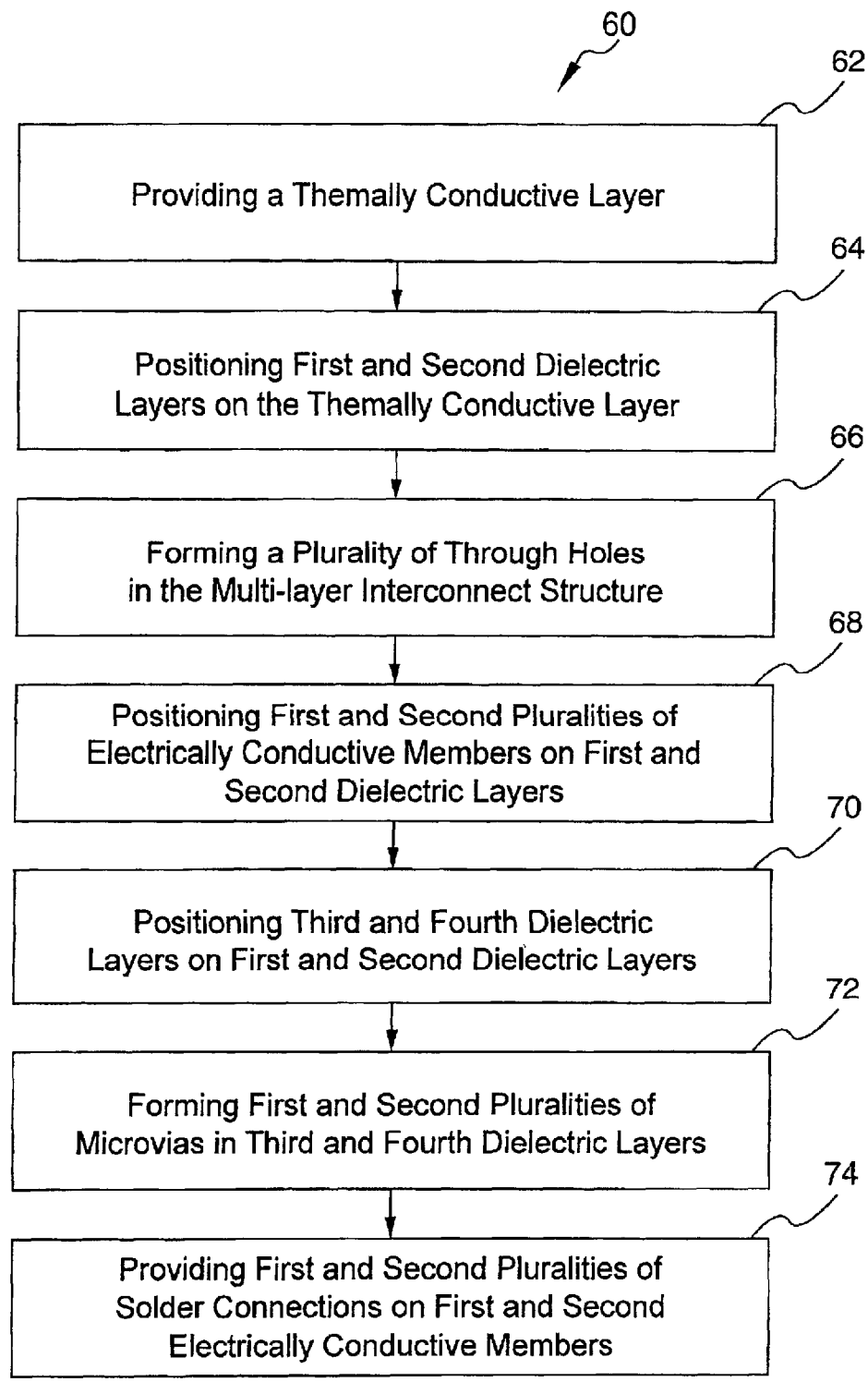
FIG. 2 is a process flow diagram showing a method for making the electronic package of FIG. 1, in accordance with preferred embodiments of the present invention.

Referring to FIG. 2, a method 60 of making the multi-layered interconnect structure 18 of FIG. 1 is shown. The resulting multi-layered interconnect structure 18, as defined herein, is adapted for electrically interconnecting the semiconductor chip 12 and the circuitized substrate 100 using solder connections. The first step 62 in this method is providing a thermally conductive layer 22 having first and second opposing surfaces 24 and 26. The multi-layer interconnect structure has been previously described supra in detail and includes a thermally conductive layer material having a selected thickness and coefficient of thermal expansion.

Next, step 64 includes positioning first and second dielectric layers 28 and 34 on the first and second opposing surfaces 24 and 26, respectively, of the thermally conductive layer 22. Step 64 is performed by laminating copper clad, silica filled PTFE layers in a laminating press at a pressure of about 1000 to about 2000 pounds per square inch (psi.) and at a temperature of about 600 to about 750 degrees Fahrenheit (° F.) to the first and second opposing surfaces of the thermally conductive layer.

Step 66 includes forming the plurality of through holes 50 and 52 in the multi-layered interconnect structure 18 by laser drilling with a YAG or excimer laser. Other suitable means of drilling are possible, such as mechanical drilling. The through holes 50 and 52 formed are from about 0.5 to about 2.0 mils in diameter. The holes 50 and 52, and the internal walls of the holes 50 and 52, are then cleaned in preparation for the addition of a conductive layer. The copper cladding on the first and second dielectric layers 28 and 34 and the internal walls of the plurality of through holes 50 and 52 are then electrolessly seeded and plated with a continuous layer of a metal. The walls are plated with a thickness of metal from about 0.1 to about 1.0 mils. Suitable metals are copper and aluminum, with copper being the preferred metal.

Step 68 illustrates positioning first and second pluralities of electrically conductive members 40 and 42 on the first and second dielectric layers 28 and 34, respectively, by any method known to one of ordinary skill in the art. For example, a photoresist may be applied on the surfaces of the plated copper clad dielectric layers. The photoresist tents the plurality of plated through holes 50 and 52 to protect the plated internal walls of the plated through holes 50 and 52 from subsequent etching steps. The photoresist is then exposed and developed. A pattern of first and second pluralities of electrically conductive members 40 and 42 is then formed by etching the exposed portions of the plated metal and the copper cladding on the surface of the first and second dielectric layers 28 and 34, respectively, with a cupric etch. The photoresist is then stripped with a caustic stripper, such as sodium hydroxide, resulting in first and second pluralities of electrically conductive metal members 40 and 42 on the surfaces of the first and second dielectric layers 28 and 34, respectively. The first plurality of electrically conductive members 40 are preferably formed as substantially dog bone shaped segments. Each segment includes at least two metal pads; one end of the substantially dog bone shaped segment, the first metal pad, being connected to the metal plating on the internal walls of one of the plurality of plated through holes 50 or 52 at the surface of the first dielectric layer 28 and the other end of the substantially dogbone shaped segment being a second metal pad adapted for having a solder connection thereon and being electrically connected to the semiconductor chip 12. The first and second metal pads of each substantially dogbone shaped segment are preferably connected by a substantially straight conductor segment. The second plurality of electrically conductive members 42 are also formed of substantially dogbone shaped segments, each segment including at least two metal pads; one end of the substantially dogbone shaped segment, the third metal pad, being connected to the metal plating on the walls of one of the plurality of plated through holes 50 or 52 at the surface of the second dielectric layer 34 and the other end of the substantially dogbone shaped segment being a fourth metal pad adapted for having a solder connection thereon for connecting to circuitized substrate 100. The solder connection can be a solder ball, solder column, or a land. Third and fourth metal pads of the substantially dogbone shaped segments are also connected by a substantially straight conductor segment. Even though substantially dogbone shaped segments may be as described herein, many other pad shapes are possible.

Figure 3:
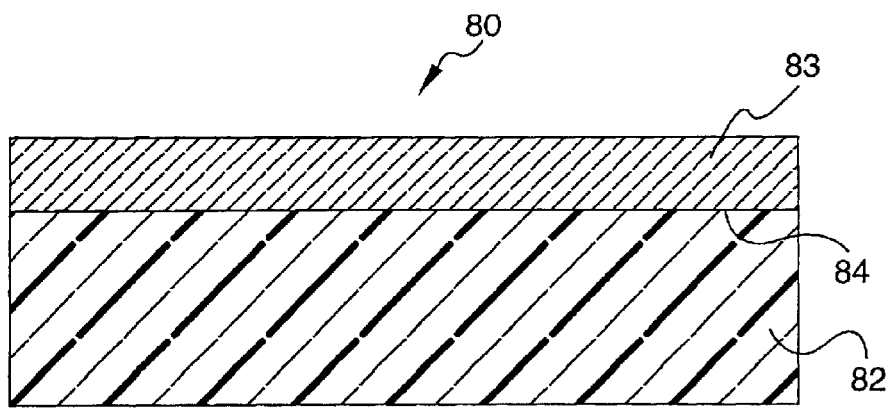
FIG. 3 depicts a front cross-sectional view of a resin coated metal comprising a dielectric resin having an allylated polyphenylene ether (APPE) on a metal foil, in accordance with preferred embodiments of the present invention.
Figure 4:
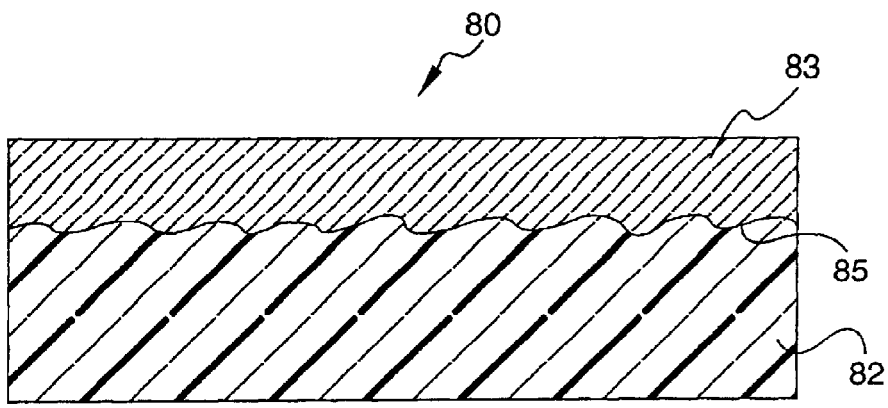
FIG. 4 depicts a FIG. 3 with zoomed view of a metal foil surface that interfaces the APPE.
Figure 5:
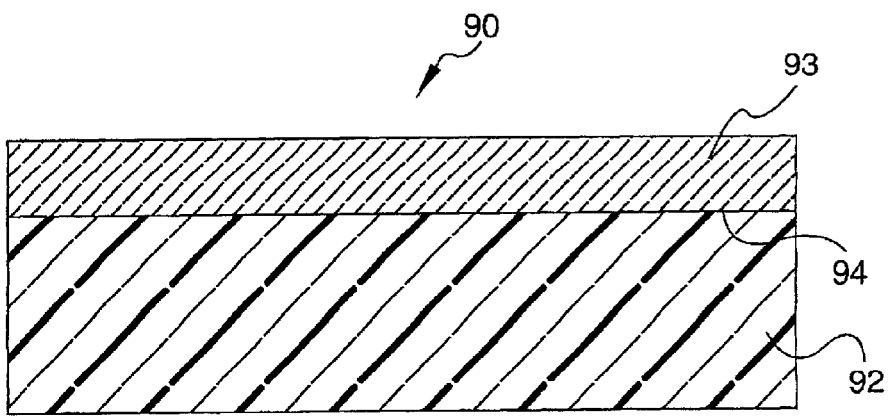
FIG. 5 depicts a front cross-sectional view of a resin coated metal comprising a dielectric resin having an APPE on a metal foil.

Step 70 includes positioning the third dielectric layer 46 on the sublayer 32 of the first dielectric layer 28 and on the first plurality of electrically conductive members 40, and the fourth dielectric layer 48 on the sublayer 38 of the second dielectric layer 34 and on the second plurality of electrically conductive members 42. FIGS. 3–5 illustrate the dielectric material of the third and fourth dielectric layers 46 and 48, respectively, said dielectric material including the preferred dielectric resin having an allylated polyphenylene ether (APPE). FIG. 3 illustrates a front cross-sectional view of a resin coated metal 80 comprising a dielectric resin 82 having an allylated polyphenylene ether (APPE), said resin 82 adhesively coupled to a metal foil 83 (e.g., a copper foil). As an example of the resin coated metal 80, the Asahi PC5103 material mentioned supra comprises the APPE resin coated on a copper foil. Inasmuch as the uncured resin 82 has mechanical properties that make it difficult to handle, the mechanical structure of the metal foil 83 compensates for the difficult-to-handle mechanical structure of the resin 82. As an example of the resin coated metal 80, the Asahi PC5103 material mentioned supra comprises the APPE resin coated on a copper foil. The resin 82 has a thickness preferably between about 30 microns and about 70 microns. The metal foil 83 preferably has a thickness of at least about 9 microns. The metal foil 83 is rough in the sense of having peaks and valleys on the surface 84 of the metal foil 83, said surface 84 mechanically interfacing with the resin 82. FIG. 4 includes the surface 85 as a zoomed (i.e., blown up) view of the surface 84 of FIG. 3 showing the peaks and valleys. Noting that the metal foil 83 will be later removed, such as by etching, the roughness of the surface 84 (or 85) of the metal foil 83 will leave a surface impression on the resin 82 after the metal foil 83, is subsequently removed. Said surface impression is "complementary" to the metal roughness structure of the surface 84 (or 85); i.e., the resultant valleys and peaks in the resin 82 surface after the metal foil 83 is removed corresponds to the peaks and valleys, respectively, of the metal roughness structure 84 (or 85) that existed while the metal foil 83 was mechanically interfaced with the resin 82. The resin coated metal 80 will subsequently be transformed into the third dielectric layer 46 of FIG. 1.

FIG. 5 illustrates a front cross-sectional view of a resin coated metal 90 comprising a dielectric resin 92 having an allylated polyphenylene ether (APPE), said resin 92 adhesively coupled to a metal foil 93. The resin coated metal 90 has all of the characteristics that was discussed supra for the resin coated metal 80 of FIGS. 3 and 4, including a surface 94 of the metal foil 93 that is rough in the same manner that the surface 84 of the metal foil 83 is rough.

The resin coated metal 90 of FIG. 5 will subsequently be transformed into the fourth dielectric layer 48 of FIG. 1.

Returning to FIG. 1, exposed surfaces of the first plurality of electrically conductive members 40, second plurality of electrically conductive members 42, the first plated through hole 50, and the second plated through hole 52 are preferably oxidized. The oxidization improves the ability of the surfaces of the first plurality of electrically conductive members 40 and of the second plurality of electrically conductive members 42 to subsequently bond with the resin 82 of FIG. 3 and the resin 92 of FIG. 5, respectively. For example, if the exposed surfaces include copper, then the oxidation may be accomplished by chloriting; i.e., by applying a solution of sodium hypochloride to said exposed surfaces. After oxidizing (or chloriting), it is preferred to vacuum bake the multi-layered interconnect structure 18, at a temperature preferably between about 100° C. and about 130° C. for a time of at least about 60 minutes, to remove moisture from the laminate.

Figure 6:
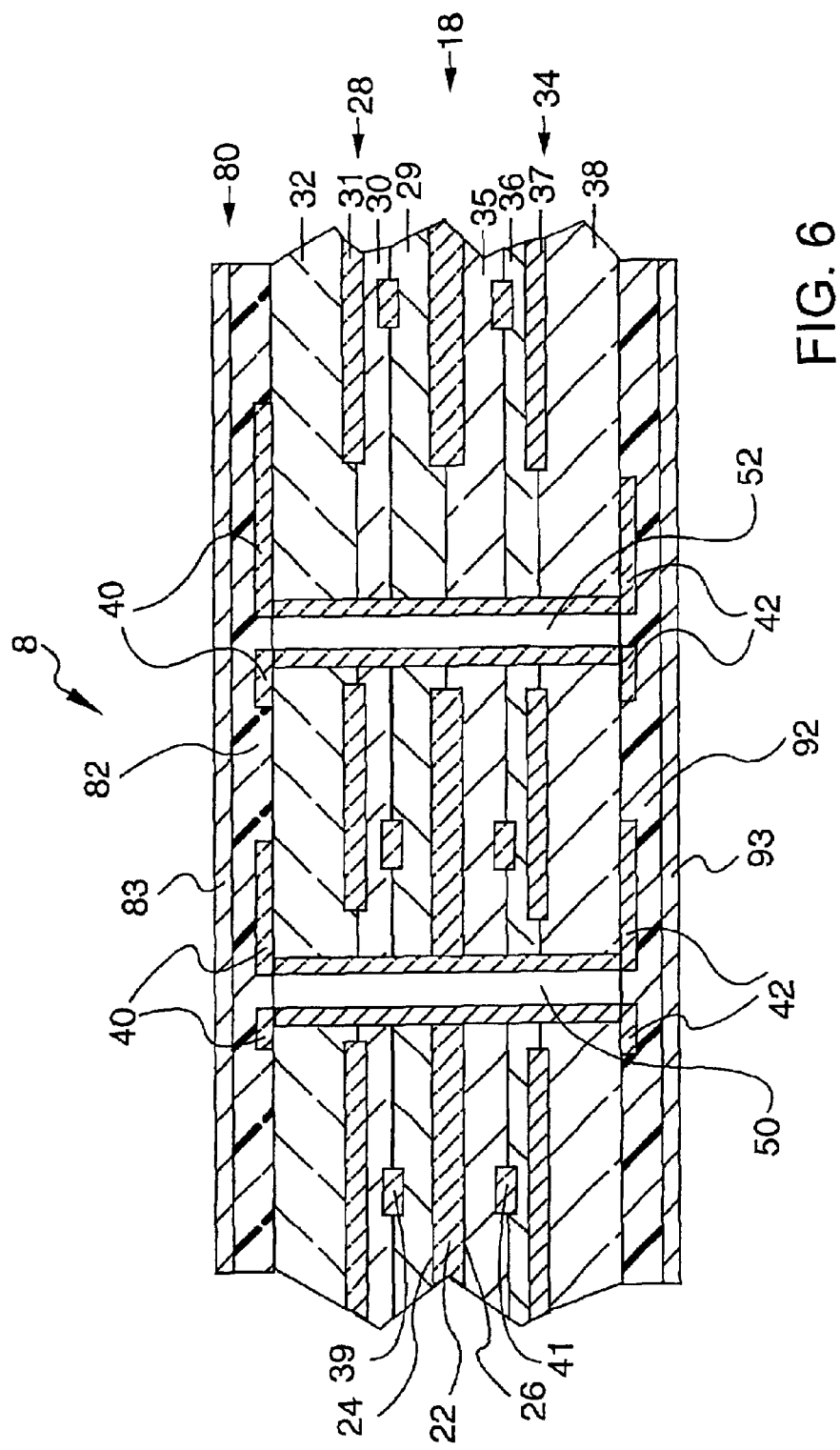
FIG. 6 depicts an electronic configuration including: the resin coated metal of FIG. 3, the resin coated metal of FIG. 5, and a portion of the multi-layered interconnect structure of FIG. 1.
Figure 7:
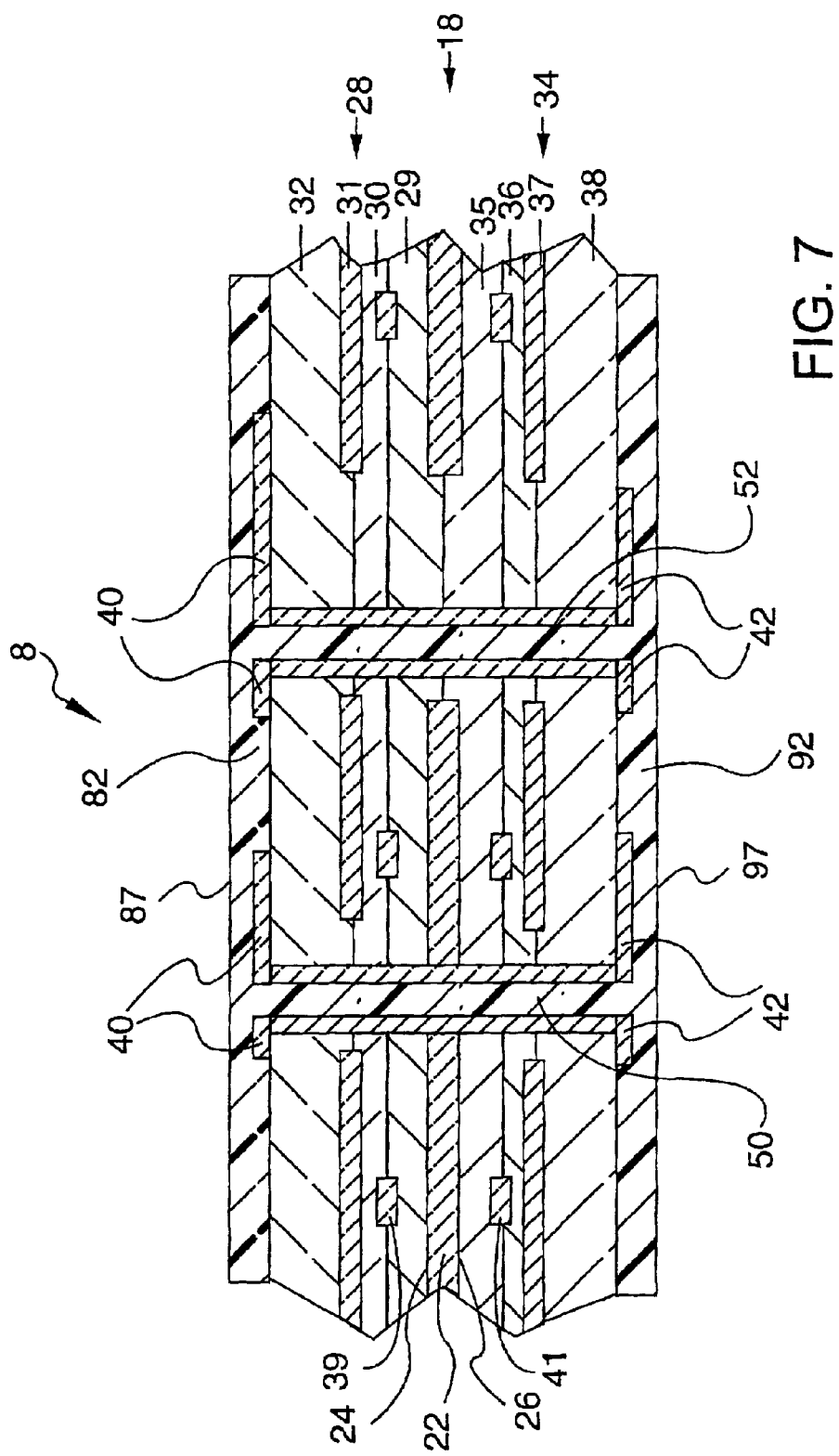
FIG. 7 depicts FIG. 6 after the electronic configuration has been pressurized and after the metal foils of the resin coated metals have removed.

For the preferred dielectric resin, Step 70 further includes (after the aforementioned oxidation): placing the resin coated metal 80 on the sublayer 32 of the first dielectric layer 28 and on the first plurality of conductive members 40 with the metal foil 83 exposed, and placing the resin coated metal 90 on the sublayer 38 of the second dielectric layer 34 and on the second plurality of electrically conductive members 42 with the metal foil 93 exposed, as shown in FIG. 6. The electronic configuration 8 of FIG. 6 includes the resin coated metal 80 of FIG. 3, the resin coated metal 90 of FIG. 5, and a portion of the multi-layered interconnect structure 10 of FIG. 1. Next, the electronic configuration 8 of FIG. 6 is pressurized in a range of about 1000 psi to about 2000 psi at an elevated temperature between about 180° C. and about 210° C. for a time of at least about 90 minutes. The pressurization and elevated temperatures causes the dielectric resins 82 and 92 to flow and become cured. The pressurization and elevated temperature adhesively laminates: the dielectric resin 82 of the resin coated metal 80 to the sublayer 32 of the first dielectric layer 28 and to the first plurality of electrically conductive members 40; and the dielectric resin 92 of the resin coated metal 90 to the sublayer 38 of the second dielectric layer 34 and to the second plurality of electrically conductive members 42. Additionally, the pressurization and elevated temperature causes the dielectric resin 82 and the dielectric resin 92 to substantially fill (i.e., completely fill aside from air pockets and/or air bubbles) the first plated through hole 50 and the second plated through hole 52, as shown in FIG. 7. After the pressurization, the metal foil 83 and the metal foil 93 are removed in a manner known to one of ordinary skill in the art, such as by etching. FIG. 7 depicts FIG. 6 after the electronic configuration 8 has been pressurized, and after the metal foils 83 and 93 have been removed. Following the pressurization and removal of the metal foils 83 and 93, the remaining dielectric resin 82 in FIG. 7 is the third dielectric layer 46 in FIG. 1, and the remaining dielectric resin 92 of FIG. 7 is the fourth dielectric layer 48 in FIG. 1. The surface 87 of the dielectric resin 82 is rough, and complementary to the rough surface 84 of the metal foil 83 of FIG. 3. The surface 97 of the dielectric resin 92 is rough, and complementary to the rough surface 94 of the metal foil 93 of FIG. 3. The roughness of the surface 97 of the dielectric resin 92 facilitates good adhesion of subsequent copper plating on the dielectric resin 92, as discussed infra in conjunction with step 72.

Step 72, denoted in FIG. 2 in relation to FIG. 1, includes forming first pluralities of microvias 55 in the third dielectric layer 46, and second pluralities of microvias 54 in the fourth dielectric layer 48, by a process of removing portions of the third dielectric layer 46 and the fourth dielectric layer 48 to form first and second pluralities of openings and exposing at least portions of selected ones of the first and second pluralities of electrically conductive members 40 and 42, respectively. The openings form internal walls of the consequent first and second pluralities of microvias 55 and 54, respectively. The first and second pluralities of microvias 55 and 54 can be formed by a process of mechanical drilling, etching, or preferably laser ablating the third and fourth dielectric layers 46 and 48, respectively. If the first and second pluralities of microvias 55 and 54 are formed by laser ablation, then the first and second pluralities of microvias microvias 55 and 54 are preferably cleaned to remove particulate matter generated by the laser ablating, employing any hole-cleaning process that is known to one of ordinary skill in the art, such as by: applying a swelling agent, treating with a potassium permanganate oxidizing material, and using an acid rinse to complete the cleaning.

The internal walls of the first and second pluralities of microvias 55 and 54 are then plated with a suitable metal, preferably copper, to form conductive layers on said openings, forming electrically conductive connections from the internal walls of the third dielectric layer 46 and fourth dielectric layer 48 to selected ones of the exposed first pluralities of electrically conductive members 40 and the exposed second pluralities of electrically conductive members 42, respectively. The plating of the internal walls may be accomplished by any method known to one of ordinary skill in the art. With copper plating, for example, a seeding material (e.g., tin palladium) may be applied to the surface 97 of the dielectric resin 92 to serve as a catalyst for electrolessly plating a thin layer (e.g., 1 to 3 microns) of copper on the surface 97, followed electroplating a thicker layer (e.g., 1 mil) of copper. The roughness of the surface 97 of the dielectric resin 92 facilitates good adhesion the copper plating on the dielectric resin 92. Copper is then selectively removed, such as by etching, from a portion of the surface 97, leaving the remaining copper plating on the internal walls and also in the form of any desired copper pads surrounding (and conductively coupled to) the copper plating on the internal walls of the first and second pluralities of microvias 55 and 54.

A solder paste is then applied to the plated first and second pluralities of microvias 55 and 54, respectively, the preferred solder paste being a low melt solder paste such as a eutectic solder paste. An examples of suitable eutectic solder paste that can be used is Alpha 3060 from Alpha Metals (Jersey City, N.J.). The microvias 55, together with the suitable metal plating on the internal walls of the microvias 55, may be denoted as a plated blind via. Similarly, the microvias 54, together with the suitable metal plating on the internal wall of the microvias 54, may also be denoted as a plated blind via.

Referring to step 74, the solder paste can then be reflowed to form part of the first and second pluralities of solder connections 47 and 20 on the first and second pluralities of electrically conductive members 40 and 42, respectively.

Next, the semiconductor chip 12 is conductively coupled to the first plurality of microvias 55 by the plurality of contact members 16 (e.g., C4 solder balls), and the circuitized substrate 100 is conductively coupled to the second plurality of microvias 54 by the second plurality of solder connections 20 (e.g., BGA solder balls). As stated supra, any electronic device (e.g., a semiconductor chip) may be conductively coupled to a microvia of the first plurality of microvias 55, and any electronic device (e.g., a circuitized substrate) may be coupled to a microvia of the second plurality of microvias 54. Also as stated supra, one microvia (or plated blind via), in addition to the first plurality of microvias 55, in the third dielectric material 46 is within the scope of the present invention, and one microvia (or plated blind via), in addition to the second plurality of microvias 54, in the fourth dielectric material 48 is within the scope of the present invention.

Referring to FIG. 1, a method of making the electronic package 10 comprises the following steps. First a semiconductor chip 12 is provided having a first surface which includes a plurality of contact members 16. The plurality of contact members 16 can be pads, columns, or balls (i.e., spheres) of high melt solder. High melt solder is defined as a solder having a melting point above about 230° C. Preferably, the plurality of contact members 16 comprises solder balls. Next, a multi-layered interconnect structure 18, as described above, is provided. The multi-layered interconnect structure 18 includes a first plurality of solder connections 47, a first plurality of plated microvias 55 including a first layer of reflowed solder paste thereon. The first layer of reflowed solder paste may be formed by applying the first solder paste to the plurality of plated microvias 55 followed by reflowing the first solder paste. A second layer of solder paste, having low melt solder paste (preferably eutectic solder paste), can be applied to the plurality of first solder connections 47 and reflowed, and the semiconductor chip's contact members 16 are each brought in contact with respective ones of the first plurality of solder connections 47 by positioning respective ones of the contact members 16 of the semiconductor chip 12 against respective ones of the first plurality of solder connections 47. This is done by positioning and aligning the semiconductor chip contact members 16 onto the reflowed solder paste. The reflowed solder paste may be shaped or contoured so as to accommodate the geometrical shape of contact members 16. For example, the reflowed solder paste may be shaped to have a flat top surface so as to accommodate contact members 16 having a spherical shape. The reflowed solder paste is then reflowed again and molten solder covers the exposed area of the plurality of microvias 55 and partially wicks up the external walls of contact members 16 of the semiconductor chip 12. Upon cooling, the molten solder solidifies and forms an electrical connection 47 between the semiconductor chip 12 and the multi-layered interconnect structure 18. The fact that the semiconductor contact members 16, have a higher melting point than the solder paste results in a solder standoff as well as an electrical connection between the semiconductor chip 16 and the multi-layered interconnect structure 18. This aides in reducing a portion of the strain between the semiconductor chip 12 and the multi-layered interconnect structure 18 during operation of the package.

The electronic package 10 of the present invention can be assembled to a circuitized substrate 100 having a plurality of contact pads 103 on one of its surfaces 104. As described, these contact pads 103 can be comprised of copper or aluminum or another suitable metal and can be coated with a layer of solder paste (not shown). The second plurality of solder connections 20 (e.g., solder balls or solder columns) of the multi-layered interconnect structure 18 are placed in contact with the solder paste on the contact pads 103 of the circuitized substrate 100. The solder paste and second solder connections 20 are reflowed and cooled forming an electrical connection between the multi-layered interconnect structure 18 and the circuitized substrate 100. The sequence of assembly of the semiconductor chip 12 to the multi-layered interconnect structure 18, followed by assembly of the multi-layered interconnect structure 18 to the circuitized substrate 100, can easily be modified. For example, the multi-layered interconnect structure 18 can be assembled to the circuitized substrate 100, followed by assembly of the semiconductor chip 12 to the multi-layered interconnect structure 18.

The electronic package 10 described herein provides signal and power distribution characteristics which complement high performance electrical demands of future semiconductor chips and is particularly suited for interconnecting high I/O (greater than 400 I/O) semiconductors. A low impedance power distribution is achieved using the solid copper power planes and high density plated through holes under the semiconductor chip which allow multiple vertical power feeds to the semiconductor chip. Further electrical performance benefits and preservation of signal integrity (fast signal propagation, low signal capacitance and coupled noise, and matched characteristic impedance) are achieved in the electronic package by use of low dielectric constant PTE material (Er<3), the signal carrying conductors being arranged internally in a shielded arrangement, and a direct short path length for the semiconductor chip contact members to the signal carrying conductors.

The scope of the present invention includes the electronic package 10 of FIG. 1 with removal of: the first dielectric layer 28, the second dielectric layer 34, and the thermally conductive layer 22.

While the electronic package 10 described herein includes a first plurality of electrically conductive members 40, it is within the scope of the present invention for the electronic package 10 to additionally include at least one first electrically conductive member 40.

While the electronic package 10 described herein includes a second plurality of electrically conductive members 42, it is within the scope of the present invention for the electronic package 10 to additionally include at least one second electrically conductive member 42.

While the electronic package 10 described herein includes a first plurality of microvias 55, it is within the scope of the present invention for the electronic package 10 to additionally include at least one first microvia 55.

While the electronic package 10 described herein includes a second plurality of microvias 54, it is within the scope of the present invention for the electronic package 10 to additionally include at least one second microvia 54.

While the electronic package 10 described herein includes a first plurality of solder connections 47, it is within the scope of the present invention for the electronic package 10 to additionally include at least one first solder connection 47.

While the electronic package 10 described herein includes a second plurality of solder connections 20, it is within the scope of the present invention for the electronic package 10 to additionally include at least one second solder connection 20.

While the electronic package 10 described herein includes a plurality of contact members 16, it is within the scope of the present invention for the electronic package 10 to additionally include at least one contact member 16.

While the electronic package 10 described herein includes a plurality of contact pads 103, it is within the scope of the present invention for the electronic package 10 to additionally include at least one contact pad 103.

While the electronic package 10 described herein includes a plurality of conductive bonding pads 56, it is within the scope of the present invention for the electronic package 10 to additionally include at least one conductive bonding pad 56.

While the electronic package 10 described herein includes a plurality of through holes 50 and 52, it is within the scope of the present invention for the electronic package 10 to additionally include at least one through hole 50 or 52.

While there have been shown and described what are at present considered the preferred embodiments of this invention, it will be obvious to those skilled in the art that various changes and modifications can be made therein without departing from the scope of the invention as defined by the appended claims.

We claim:

1. A method of making a multi-layered interconnect structure, comprising the steps of:
   providing a thermally conductive layer including first and second opposing surfaces;
   forming first and second dielectric layers on said first and second opposing surfaces, respectively, of said thermally conductive layer;
   forming first and second pluralities of electrically conductive members on said first and second dielectric layers, respectively;
   forming a first electrically conductive layer within said first dielectric layer;
   forming a second electrically conductive layer within said first dielectric layer and positioned between said first electrically conductive layer and said thermally conductive layer, wherein said second electrically conductive layer comprises a first plurality of shielded signal conductors;
   forming a plated through hole through the multi-layered interconnect structure electrically connected to at least one member of said first plurality of electrically conductive members, to at least one of said first plurality of shielded signal conductors, and to at least one member of said second plurality of electrically conductive members; and
   forming a third dielectric layer on said first dielectric layer and on portions of said first plurality of electrically conductive members, said third dielectric layer substantially overlying said plated through hole, and wherein said third dielectric layer includes a first high density interconnect layer for providing an electrical path from a first electronic device to the first plurality of shielded signal conductors.

2. The method of claim 1, wherein a coefficient of thermal expansion (CTE) of the thermally conductive layer is between about one third and about two thirds of an overall CTE of the multi-layered interconnect structure.

3. The method of claim 1, wherein said third dielectric layer includes a resin comprising an allylated polyphenylene ether.

4. The method of claim 3, wherein the step of forming a third dielectric layer comprises:
   providing a sheet that includes a layer of the resin on a rough surface of a metal foil;
   placing the sheet on said first dielectric layer and on said first plurality of electrically conductive members, wherein the metal foil is exposed;
   pressurizing the multi-layered interconnect structure at a pressure, elevated temperature, and for a time duration necessary for the resin to cure and for the layer of the resin to adhesively laminate to said first dielectric layer and to said first plurality of electrically conductive members; and
   removing the metal foil, leaving an exposed rough surface of the layer of resin that is complementary to the rough surface of the first metal foil.

5. The method of claim 4, wherein metal foil includes copper.

6. The method of claim 4, wherein the removing step includes etching away the metal foil.

7. The method of claim 4, further comprising oxidizing exposed surfaces of the first plurality of electrically conductive members, before the step of placing the sheet.

8. The method of claim 4, wherein the pressure is between about 1000 psi and about 2000 psi, the temperature is between about 180° C. and about 210° C., and the time exceeds about 90 minutes.

9. The method of claim 1, further comprising forming a plated blind via in the third dielectric layer, wherein the plated blind via is conductively coupled to the at least one member of said first plurality of electrically conductive members.

10. The method of claim 9, further comprising conductively coupling an electronic device to the plated blind via.

11. The method of claim 10, wherein the electronic device is selected from the group consisting of a semiconductor chip and a circuited substrate.

12. The method of claim 10, wherein the electronic device is the semiconductor chip, and wherein the step of coupling the semiconductor chip to the plated blind via includes:
   applying a first solder paste onto the plated blind via; and
   reflowing the first solder paste to form a solder connection;
   applying a second solder paste onto the solder connection;
   positioning a contact member of the semiconductor chip on the solder connection; and
   reflowing the second solder paste to conductively couple the semiconductor chip to the plated blind via.

13. The method of claim 1, further comprising:
   forming a third electrically conductive layer within said second dielectric layer;
   forming a fourth electrically conductive layer within said second dielectric layer and positioned between said third electrically conductive layer and said thermally conductive layer, wherein said fourth electrically conductive layer comprises a second plurality of shielded signal conductors; and
   forming a fourth dielectric layer on said second dielectric layer and on portions of said second plurality of electrically conductive members, said fourth dielectric layer substantially overlying said plated through hole, wherein said fourth dielectric layer includes a second high density interconnect layer for providing an electrical path from a second electronic device to the second plurality of shielded signal conductors.

14. The method of claim 13, wherein said fourth dielectric layer includes a resin comprising an allylated polyphenylene ether.

15. The method of claim 14, wherein the steps of forming a third dielectric layer and a fourth dielectric layer comprise:
providing a first sheet that includes a first layer of the resin on a rough surface of a first metal foil;
providing a second sheet that includes a second layer of the resin on a rough surface of a second metal foil;
placing the first sheet on said first dielectric layer and on said first plurality of electrically conductive members, wherein the first metal foil is exposed;
placing the second sheet on said second dielectric layer and on said second plurality of electrically conductive members, wherein the second metal foil is exposed;
pressurizing the multi-layered interconnect structure at a pressure, elevated temperature, and for a time duration necessary for the resin to cure, for the first layer of the resin to adhesively laminate to said first dielectric layer and to said first plurality of electrically conductive members, and for the second layer of the resin to adhesively laminate to said second dielectric layer and to said second plurality of electrically conductive members;
removing the first metal foil, leaving an exposed rough surface of the first layer of resin that is complementary to the rough surface of the first metal foil; and
removing the second metal foil, leaving an exposed rough surface of the second layer of resin that is complementary to the rough surface of the second metal foil.

16. The method of claim 15, further comprising:
oxidizing exposed surfaces of the first plurality of electrically conductive members, before the step of placing the first sheet; and
oxidizing exposed surfaces of the second plurality of electrically conductive members, before the step of placing the second sheet.

17. The method of claim 15, wherein the pressure is between about 1000 psi and about 2000 psi, the temperature is between about 180° C. and about 210° C., and the time exceeds about 90 minutes.

18. The method of claim 13, further comprising:
forming a first plated blind via in the third dielectric layer, wherein the first plated blind via is conductively coupled to the at least one member of said first plurality of electrically conductive members; and
forming a second plated blind via in the fourth dielectric layer, wherein the second plated blind via is conductively coupled to the at least one member of said second plurality of electrically conductive members.

19. The method of claim 18, further comprising:
forming a first solder connection conductively coupled to the first plated blind via;
forming a second solder connection conductively coupled to the second plated blind via;
conducively coupling a first electronic device, by the first solder connection, to the first plated blind via; and
conductively coupling a second electronic device, by the second solder connection, to the second plated blind via.

20. The method of claim 19, wherein the first electronic device is a semiconductor chip, and wherein second electronic device is a circuitized substrate.

21. The method of claim 19, wherein the multi-layered interconnect structure has an overall CTE that prevents failure of: the first solder connection, the second solder connection, and interconnection within the multi-layered interconnect structure.

22. The method of claim 19, wherein the difference between an overall CTE of the multi-layered interconnect structure and a CTE of the first electronic device is between about 40% and about 60% of the difference between a CTE of the second electronic device and the CTE of the first electronic device.

23. A method of making a multi-layered interconnect structure, said method comprising:
providing a substrate that includes an organic dielectric material;
forming first and second electrically conductive members, respectively, on a first and second surface of the substrate;
forming a plated through hole through the multi-layered interconnect structure, wherein the plated through hole is conductively coupled to the first and second electrically conductive members;
forming a first dielectric layer positioned on the first surface of the substrate and on a portion of the first electrically conductive member, wherein the first dielectric layer substantially overlies the plated through hole, and wherein the first dielectric layer includes a first high density interconnect layer for providing an electrical path from a first electronic device to a first plurality of shielded signal conductors located within the substrate; and
forming a second dielectric layer positioned on the second surface of the substrate and on a portion of the second electrically conductive member, wherein the second dielectric layer substantially overlies the plated through hole, and wherein the second dielectric layer includes a second high density interconnect layer for providing an electrical path from a second electronic device to a second plurality of shielded signal conductors located within the substrate.

24. The method of claim 23, wherein the first dielectric layer includes a resin comprising an allylated polyphenylene ether, and wherein the second dielectric layer includes the resin.

25. The method of claim 23, wherein the substrate includes a thermally conductive layer positioned about equidistantly from the first surface and the second surface of the substrate.

* * * * *